(12) United States Patent
van Kempen et al.

(10) Patent No.: US 8,728,929 B2
(45) Date of Patent: May 20, 2014

(54) PRE-SOLDERED LEADLESS PACKAGE

(75) Inventors: Jan van Kempen, Cuyk (NL); René Wilhelmus Johannes Maria van den Boomen, Asten (NL); Emiel de Bruin, Elst (NL)

(73) Assignee: NXP B.V., Eindhoven (NL)

( * ) Notice: Subject to any disclaimer, the term of this patent is extended or adjusted under 35 U.S.C. 154(b) by 66 days.

(21) Appl. No.: 12/972,052

(22) Filed: Dec. 17, 2010

(65) Prior Publication Data
US 2011/0147925 A1 Jun. 23, 2011

(30) Foreign Application Priority Data
Dec. 18, 2009 (EP) .................................... 09179896

(51) Int. Cl.
*H01L 21/44* (2006.01)

(52) U.S. Cl.
USPC .......................................... 438/612; 438/613

(58) Field of Classification Search
USPC ................. 438/689, 706, 710, 720, 745, 754; 257/725, 737, E21.499, E23.01, 257/E23.068
See application file for complete search history.

(56) References Cited

U.S. PATENT DOCUMENTS

| | | | |
|---|---|---|---|
| 6,001,671 A | 12/1999 | Fjelstad | |
| 6,232,666 B1 * | 5/2001 | Corisis et al. | 257/774 |
| 6,909,178 B2 * | 6/2005 | Sakamoto et al. | 257/725 |
| 7,176,582 B2 * | 2/2007 | Kloen et al. | 257/781 |
| 7,183,652 B2 * | 2/2007 | Waidhas et al. | 257/772 |
| 7,902,648 B2 * | 3/2011 | Lee | 257/676 |
| 2003/0197199 A1 | 10/2003 | Sakamoto et al. | |
| 2004/0038471 A1 | 2/2004 | Sakamoto et al. | |

(Continued)

FOREIGN PATENT DOCUMENTS

| | | | |
|---|---|---|---|
| JP | 2002009196 A | 1/2002 | |
| JP | 2006196922 A1 | 7/2006 | |

OTHER PUBLICATIONS

"Quad Flat Pack No-Lead (QFN) Micro Dual Flat Pack No-Lead (uDFN)," http://www.freescale.com/files/analog/doc/app_note/AN1902.pdf Freescale Semiconductorm Rev. 4.0, pp. 1-34, (Sep. 2008).

(Continued)

*Primary Examiner* — Cuong Q Nguyen
*Assistant Examiner* — Yosef Gebreyesus

(57) ABSTRACT

The invention relates to a method of manufacturing a semiconductor device, the method comprising: i) providing a substrate carrier comprising a substrate layer and a patterned conductive layer, wherein the patterned conductive layer defines contact pads; ii) partially etching the substrate carrier using the patterned conductive layer as a mask defining contact regions in the substrate layer; iii) providing the semiconductor chip; iv) mounting said semiconductor chip with the adhesive layer on the patterned conductive layer such that the semiconductor chip covers at least one of the trenches and part of the contact pads neighboring the respective trench are left uncovered for future wire bonding; v) providing wire bonds between respective terminals of the semiconductor chip and respective contact pads of the substrate carrier; vi) providing a molding compound covering the substrate carrier and the semiconductor chip, and vii) etching the backside (S2) of the substrate carrier to expose the molding compound in the trenches. The invention further relates to a semiconductor device manufactured with such method, and to a printed-circuit board comprising such semiconductor device. The invention enables a reduced minimum bondpad pitch. An embodiment of the invention has a by-design-wettable terminal side at the perimeter of the device. This latest mentioned feature enables automated board inspection w.r.t. board mounting quality.

8 Claims, 6 Drawing Sheets

(56) References Cited

U.S. PATENT DOCUMENTS

2004/0169276 A1* 9/2004 Tan .............................. 257/737
2006/0091553 A1* 5/2006 Narizuka et al. ............. 257/762
2007/0176303 A1   8/2007 Murai et al.
2007/0205496 A1* 9/2007 Haba et al. ................... 257/686
2009/0032943 A1   2/2009 Shoji et al.
2009/0121334 A1* 5/2009 Oi et al. ........................ 257/678
2009/0170241 A1* 7/2009 Shim et al. ................... 438/107

OTHER PUBLICATIONS

"What is QFN (MPL, MLF)," http://www.hdsemitech.com/query/upload/1116489164.pdf, HD Semitech Co., Ltd.
M. J. Ramos, et al. "The Method of Making Low-Cost Multiple-Row QFN," http://www.unisemgroup.com/pdf/articles/8_29_Low_Cost_Multiple_RowELP.pdf Unisem Singapore Ptd Ltd.
Extended European Search Report for Patent Appln. No. 09179896.7 (Oct. 6, 2010).

* cited by examiner

PRE-SOLDERED LEADLESS PACKAGE

This application claims the priority under 35 U.S.C. §119 of European patent application no. 09179896.7, filed on Dec. 18, 2009, the contents of which are incorporated by reference herein.

FIELD OF THE INVENTION

The invention relates to a method of manufacturing a semiconductor device, and in particular to the packing of such semiconductor device in the surface-mount technology field. The invention further relates to a semiconductor device manufactured with such method, and to a printed-circuit board comprising such semiconductor device.

BACKGROUND

The International Technology Roadmap for Semiconductors is a set of documents produced by a group of semiconductor industry experts. These experts are representative of the sponsoring organizations which include the Semiconductor Industry Associations of the US, Europe, Japan, Korea and Taiwan. The documents represent best opinion on the directions of research into the following areas of technology, including time-lines up to about 15 years into the future: System Drivers/Design, Test & Test Equipment, Front End Processes, Photolithography, IC Interconnects, Factory Integration, Assembly & Packaging, Environment, Safety & Health, Yield Enhancement, Metrology, Modeling & Simulation, Emerging Research Devices, and Emerging Research Materials.

In order to keep pace with the ITRS roadmap a strong focus on packaging is visible in the prior art, and in particular in the surface-mount technology (SMT). Within this field Quad Flat Packages (QFP) have been very popular for a long time. A QFP is an integrated circuit package with leads extending from each of the four sides. It has been primarily used for surface mounting (SMD). In the prior art versions have been reported in the range from 32 to over 200 pins with a pitch ranging from 0.4 to 1.0 mm. Special cases include Low-profile (LQFP) and Thin-QFP (TQFP). The QFP package type became common in Europe and US during the early nineties, but QFP components have been used in Japanese consumer electronics since the seventies, most often mixed with hole-mounted, and sometimes socketed, components on the same printed circuit board.

Quad-Flat-No-leads (QFN) or Microleadframe (MLF) packages physically and electrically connect integrated circuits to printed circuit boards. QFN is a surface-mount technology, one of several package technologies that connect ICs to the surfaces of PCBs without through-holes. The QFN package is similar to the Quad Flat Package, but in QFN packages the terminals/leads are mainly at the package bottom side and do not or only slightly extend out from the package sides. This is a near chip scale package (CSP) plastic encapsulated package made with a planar copper lead frame substrate. Perimeter lands on the package bottom provide electrical connections to the PCB. In most cases the package includes an exposed thermal pad to improve heat transfer out of the IC (into the PCB). Heat transfer can be further facilitated by metal vias in the thermal pad.

A problem of the known packages in surface-mount technology is that the bondpad pitch is still relatively large, which does not comply with the ITRS roadmap for the future.

SUMMARY

It is a first object of the invention to provide a method of manufacturing a semiconductor device, wherein the minimum bondpad pitch is reduced. It is a second object of the invention to provide a semiconductor device manufactured in accordance with such method.

The invention is defined by the independent claims. The dependent claims define advantageous embodiments.

In a first aspect, in accordance with the first object, the invention relates to a method as claimed in claim 1.

The effect of the features of the invention is as follows. First of all, rather than placing the semiconductor chip between the contact pads in this method the semiconductor chip is placed on the contacts pads. Second, the method is a 1-ply process with only a non-critical etch step for defining the contact pads/regions.

Initially the substrate layer may be thick in order to give mechanical strength to the structure during the provision of the wire bonds. Then the molding compound is provided which gives the structure even more mechanical stability, whereafter the structure is etched from the backside to separate the contact regions. The latter process step is selective and therefore not timing critical, i.e. the amount of substrate layer material that is removed is not critical. Because of this the contact structures (contact pads with substrate layer) may be kept thinner and thus the pitch between the contact regions may also be kept smaller. Expressed differently, the trenches may be less deep and therefore also less wide, i.e. a smaller bondpad pitch can be obtained. 1-ply means that the substrate carrier only comprises a substrate layer and a patterned conductive layer on top and that the substrate layer is etched back from a backside at a later stage. The patterned conductive layer may comprise a stack of sublayers, such as a stack comprising a nickel layer with a gold plating (NiAu), or a stack of nickel, palladium, gold (NiPdAu). What is important is that the conductive layer is suitable for locking to the molding compound and suitable for wire-bonding. Removing the substrate layer completely has the advantage that deeper cavities or trenches are formed on the backside of the semiconductor device which may be conveniently filled with solder material at a later stage. Deeper cavities filled with solder material provide an additional stress relieve by design between the rigid materials of the package and the PCB. This is more commonly referred to as second board reliability. Furthermore, the adhesion between solder material and the contact region is better than between solder material and many substrate layer materials, in particular in case the substrate layer material oxidizes. This embodiment is therefore extremely robust w.r.t. terminal wettability.

An embodiment of the method in accordance with the invention further comprises:

providing solder material on each respective one of the contact regions for being attached to receiving contacts of a printed-circuit board. The provision of a solder material on the packaged semiconductor device in this stage is advantageous, because the assembly/mounting of the component on a printed-circuit board (PCB) has become easier. During such assembly/mounting the PCB solder bumps melt together with the solder material of the semiconductor device, which provides for a good electrical contact, i.e. the reliability of the PCB is increased. A solder material which is commonly used nowadays is tin based (Sn). However the invention is not limited to such solder material.

In an embodiment of the method in accordance with the invention the providing of the solder material comprises screen printing solder paste on the backside of the substrate layer. The inventors discovered that the screen printing technique may be conveniently applied to the back-side of the semiconductor device for applying the solder material. In a variant of this embodiment the solder material is provided by solder ball placement.

An embodiment of the method in accordance with the invention further comprises: heating the semiconductor device to a predefined temperature during a predefined time period to obtain reflow of the solder material for forming solder bumps on the backside of the semiconductor device at locations of the contact regions. In the previous embodiment the screen printing results in a layer of solder material on the backside of the semiconductor device. The additional step in this embodiment ensures that solder bumps are formed, which is more convenient when the semiconductor device is mounted on a PCB.

An embodiment of the method in accordance with the invention further comprises: cutting the semiconductor device outside an area of the contact regions for obtaining a packaged semiconductor chip. In this embodiment the semiconductor device is separated. This may be done using conventional sawing or cutting techniques. Sometimes it is also being referred to as "dicing" in the prior art. It must be noted that the method of the invention is very suitable to manufacture many semiconductor devices in parallel. In such embodiment the substrate carrier is provided with many sets of contact pads, each set being configured for receiving a semiconductor chip or multiple chips (which may be the same size or different sizes, and which may have the same bondpad configuration or different bondpad configurations). Furthermore, in the step of providing the semiconductor chip, a plurality of semiconductor chips is provided, and in the step of cutting, a plurality of separated semiconductor devices is obtained.

In an embodiment of the method in accordance with the invention the patterned conductive layer is configured for defining contact pads with a pitch smaller than or equal to 400 μm, preferably smaller than 250 μm, and even more preferably smaller than or equal to 150 μm. The method of the invention advantageously features smaller pitch sizes than the conventional methods, but it is not restricted to small pad pitches only.

In an embodiment of the method in accordance with the invention, during the providing of the solder material, the solder material is provided directly on the backside of the contact pads. This embodiment results in a good adhesion of solder material to the contact pads.

In an embodiment of the method in accordance with the invention, during the cutting of the semiconductor device, the semiconductor device is cut just along an outer envelope of the solder bumps such that the solder bumps are exposed to an outer side of the semiconductor device. This embodiment is very advantageous and builds on the last-two mentioned embodiments. The structure achieved with this embodiment has become sidewettable, which means that the solder bumps may be contacted from the bottom side as well as from the side. The fact that the substrate layer (such as copper) is completely removed and replaced with solder material makes the structure even more reliable. Mounting such structure on a PCB provides for a very good electrical contact between the PCB and the semiconductor device and in addition the sidewetting profile can be assured by design and therefore specified in a specification. This design feature makes it a very good device for automatic PCB board inspection.

In a second aspect, in accordance with the second object, the invention relates to a semiconductor device as claimed in claim 10. The advantage of the semiconductor device, which results from the method is that the minimum bondpad pitch is reduced with regards to the semiconductor devices of the prior art.

In a third aspect the invention relates to a printed-circuit board comprising the semiconductor device in accordance with the invention.

These and other aspects of the invention are apparent from and will be elucidated with reference to the embodiments described hereinafter.

LIST OF REFERENCE NUMERALS

Figure 1:
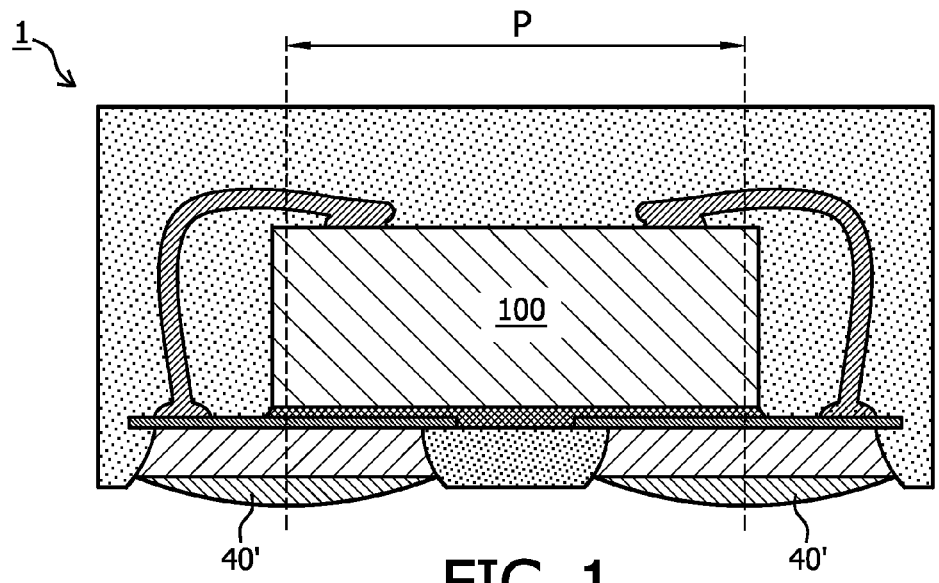
FIG. 1 shows a semiconductor device in accordance with an embodiment of the invention.

1 semiconductor device in accordance with first embodiment
10 substrate layer (part of substrate carrier 25)
20 patterned conductive layer
21 openings in patterned conductive layer
22 bondpads
25 substrate carrier
S1 first surface
S2 second surface
29 trenches
100 semiconductor chip
105 adhesive layer on backside of semiconductor chip 100
110 bondwires
30 molding compound
35 contact regions
40 paste-printed solder material
40' solder bumps (after reflow step)
99 cut lines
1' semiconductor device in accordance with second embodiment
40" solder bumps of second embodiment (after reflow step)
S3 side contact surface of solder bumps 40"
200 PCB
205 PCB carrier
210 contact pad of PCB
220 solder bump on PCB

DETAILED DESCRIPTION

In this description a method of manufacturing a semiconductor device is described in which a semiconductor chip is packaged. In the packaging process terminals are manufactured for connecting the semiconductor chip to the outside world, such as a PCB. This invention focuses on surface mount technology, and in particular to improvements for QFN and QFP packages, which are particularly used for IC's with a low-pincount, i.e. packages with typically between two and twelve bondpads. In order to keep pace with the ITRS roadmap also the packaging requirements becomes more and more stringent. Lateral dimensions of the package have to shrink. One of such lateral dimensions is the bondpad pitch. The invention provides for shrinking the minimum bondpad pitch.

In order to facilitate the discussion of the detailed embodiments a few expressions are defined hereinafter.

In this description the "front-side" of a semiconductor device is defined as the side of the semiconductor device at which the molding compound is provided. The "back-side" of the semiconductor device is defined as the side opposite to the front-side, i.e. where the contact regions are located.

FIG. 1 shows a semiconductor device in accordance with an embodiment of the invention. The semiconductor device 1 comprises an encapsulated semiconductor chip 100 and two contact terminals 40' at one side of the device, which are intended to be mounted on a PCB without the requirement of having holes in the PCB and such a device is therefore a surface-mount device (SMD). Furthermore, the contact terminals 40' comprise solder bumps in this example. As previously mentioned the provision of the solder bumps on the device itself is advantageous in case the device is soldered to a PCB, in which case a better electrical contact and an assuremend of terminal wettability is achieved.

Figure 2:
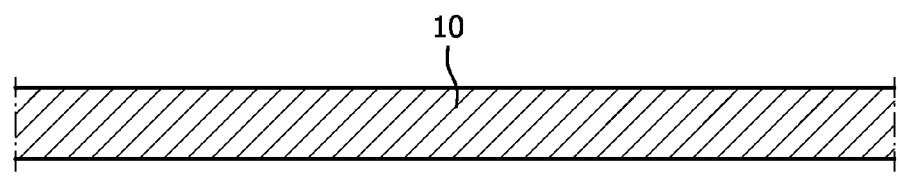
FIG. 2 to FIG. 10 shows different stages of a method of manufacturing the semiconductor device of FIG. 1 in accordance with another embodiment of the invention.

FIG. 2 to FIG. 10 shows different stages of a method of manufacturing the semiconductor device of FIG. 1 in accordance with another embodiment of the invention. In the stage of FIG. 2 a substrate layer 10 is provided, which may be copper for example. Other suitable materials are aluminum, iron, steel, bronze, brass, alloys and combinations thereof. The substrate layer may be 75 µm in an example embodiment.

Figure 3:
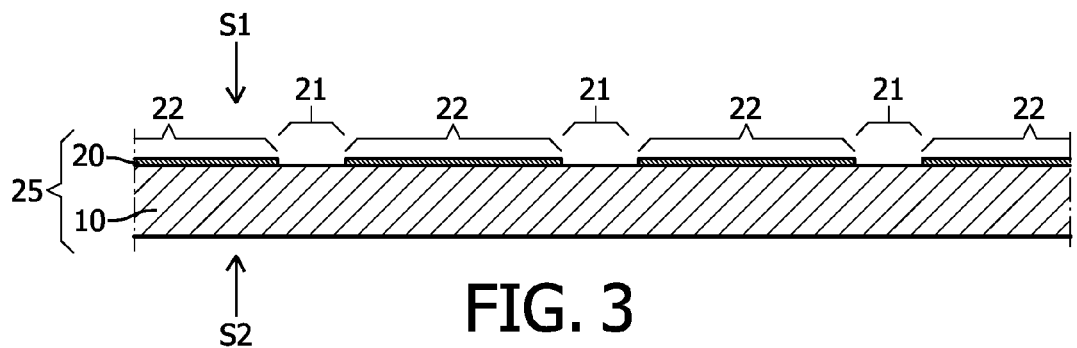

In the stage of FIG. 3 a patterned conductive layer 20 is provided on the substrate layer 10. Such layer may be provided using a plating technique for example, such as electroless plating or electrolytic plating. The patterned conductive layer 20 is provided on a front-side S1 of the semiconductor device 1, which is still an intermediate product at this stage. The back-side S2 is opposite the front-side S1 and is the side on which the contact terminals will be formed in a later stage. The patterned conductive layer 20 comprises openings 21 which define structures 22 in the conductive layer 20. The structures 22 form the contact pads for being connected to the semiconductor chip 100, which is provided at a later stage. In the example of FIG. 2 and FIG. 3 the patterned conductive layer 20 is provided on the substrate layer 10, i.e. formed in a plurality of steps. However, such combination of layers may also be bought from an external supplier as such and is referred to as a substrate carrier 25 in this description. The patterned conductive layer may comprise materials such as gold, platinum, palladium, nickel, etc. The patterned conductive layer may comprise a stack of sublayers, such as a stack comprising a nickel layer with a gold plating (NiAu), or a stack of nickel, palladium, gold (NiPdAu). What is important is that the conductive layer is suitable for locking to the molding compound and suitable for wire-bonding.

Figure 4:
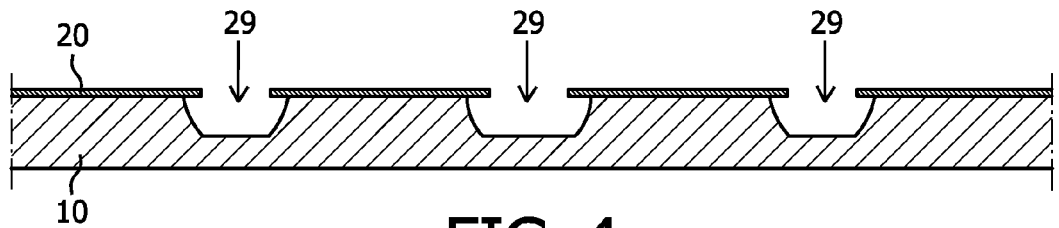

In the stage of FIG. 4 trenches 29 are etched using the patterned conductive layer 20 as a mask. The etchant, which may be alkaline or acid etch is isotropic such that the structures 22 are a bit under etched. This is not essential to the invention, but merely a consequence of the fact that the substrate layer 10 comprises one material and of the wet etching technique that is used.

Figure 5:
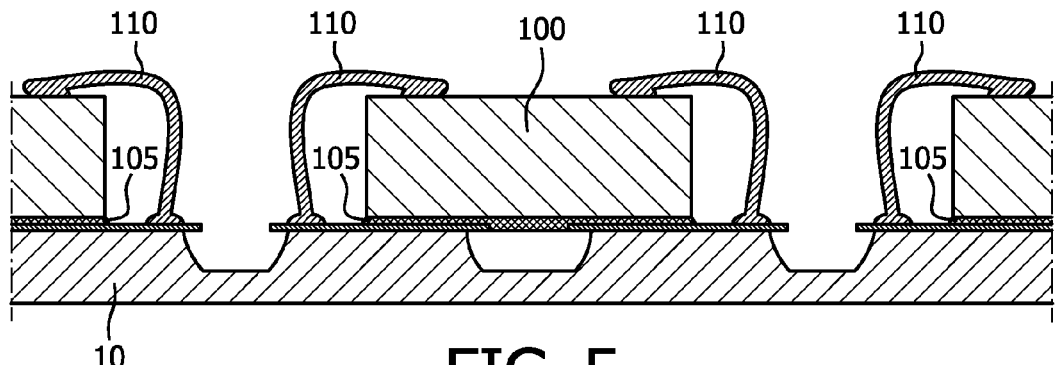

In the stage of FIG. 5 so-called function plating has been carried out, which comprises surface die bonding and wire bonding. A semiconductor chip 100 (also referred to as "die") comprising an adhesive layer 105 mounting the die on the contact pads as illustrated in the figure. In this example, on a top-side of the semiconductor chip 100 there are terminals (not shown) which are connected with wire bonds 110 to the contact pads 22. The adhesive layer 105 may comprise of a pre-applied adhesive on wafer level prior to die dicing. The semiconductor chip 100 may comprises circuitry for performing circuit functions in a system (not shown).

It must be noted at this stage that the method as illustrated in FIGS. 2 to 10 is very suitable for manufacturing a plurality of semiconductor devices 1 in parallel. The substrate carrier 25 may be designed for mounting many semiconductor chips 100 in this stage of the method. Nevertheless, for the sake of simplicity in this description reference is made to the singular form of "semiconductor device". Also, reference is made to this term whereas in most cases an intermediate stage of this semiconductor device is meant.

Figure 6:
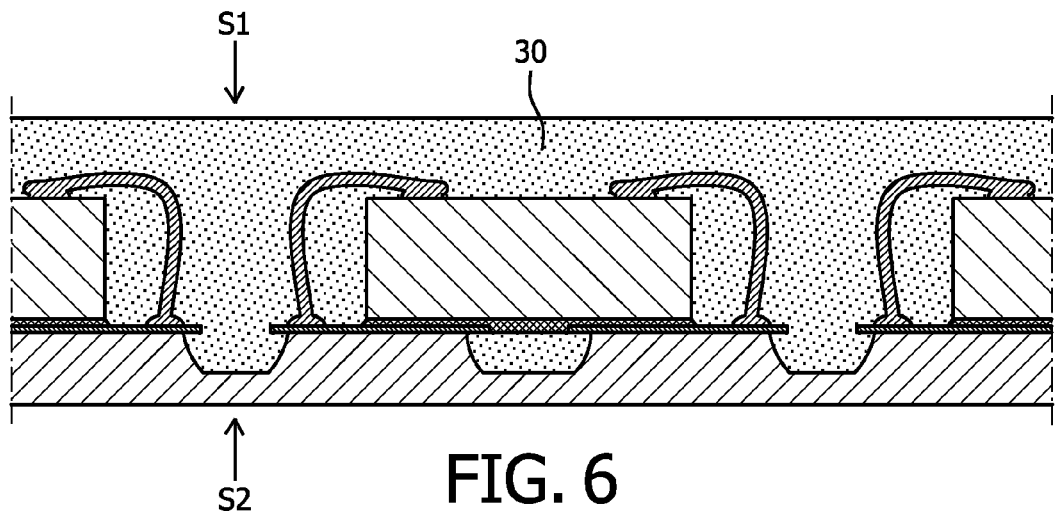

In the stage of FIG. 6 a molding compound 30 is deposited which covers the semiconductor chip 100, the bond wires 110, the contact pads 22, and which fills the trenches 29. Such molding compound may be a thermoplastic or a thermosetting plastic. The technique for providing a molding compound, as such, is considered to be well-known to the person skilled in the art.

Figure 7:
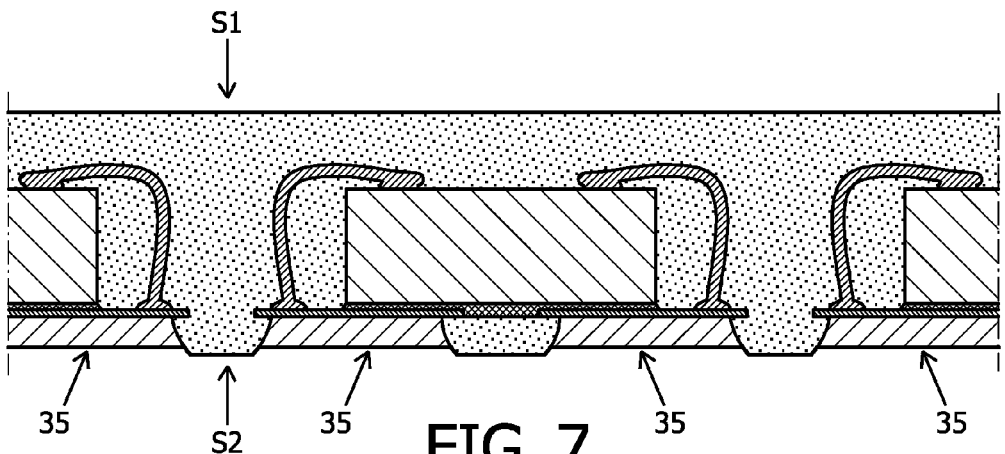

In the stage of FIG. 7 the backside S2 of the substrate carrier 25 is etched for which the same etchant may be used as in FIG. 4, for example. During this etching step contact regions 35, which were defined earlier in the process during the etching of the trenches 29, are separated from each other. The etching is preferably done selective to the substrate layer material 10, but this is not essential. If it is done selective then the substrate layer 10 may be etched a little bit further than the molding compound such that small recesses are visible on the backside S2 of the semiconductor device 1.

Figure 8:
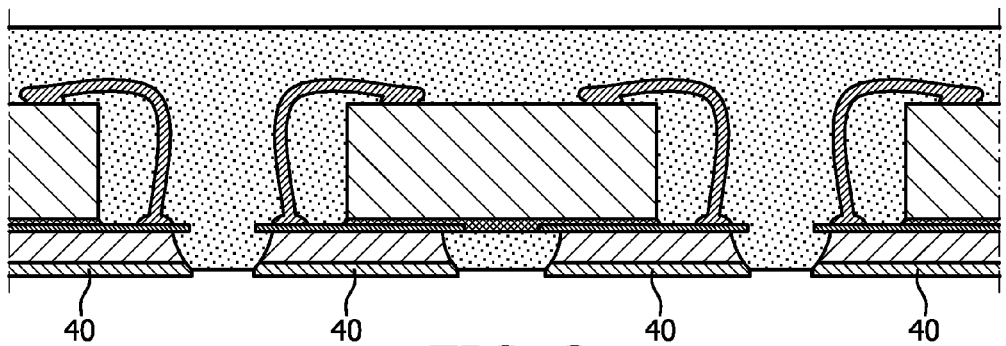

In the stage of FIG. 8 solder material 40 is screen printed on the back-side of the semiconductor device 1. Screen-printing is a very suitable technique in case the recesses have been formed as discussed with reference to FIG. 7. While doing so a thin layer of solder material is provided in the recesses as illustrated in FIG. 8. The solder material 40 used in the stage of FIG. 8 is preferably leadless tin. Finally, it must be noted that the invention is not limited to screen printing in this stage of the method.

Figure 9:
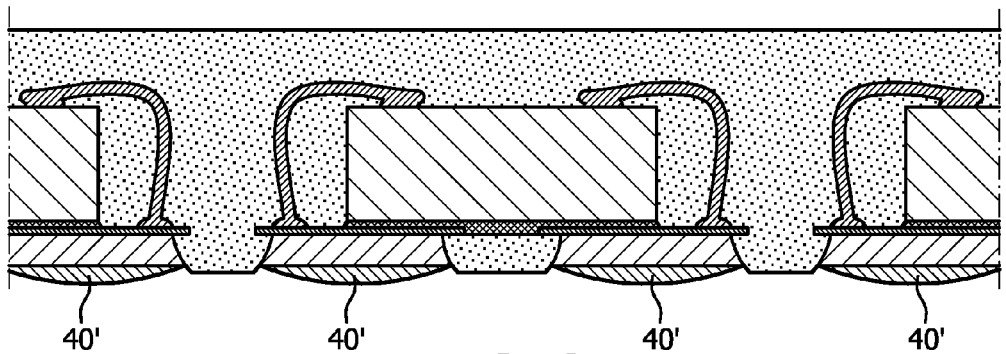

In the stage of FIG. 9 a so-called reflow-step is carried out. The semiconductor device 1 is heated to a temperature in the range between 215° C. and 260° C. during a time period of 5 s to 60 s. In this heating step the solder material will reflow to form solder bumps 40' on the backside S2 of the semiconductor device 1. The advantage of using screen-printing and reflow as illustrated in FIG. 8 and FIG. 9 is that a relatively expensive finishing technology is rendered superfluous.

Expensive finishing is NiPdAu or NiAu. Having such plating at the terminal side implies that the plating step needs to be performed after the etching step of the substrate layer or that the plating was done prior to receiving the carrier as a step before making the patterned conductive layer. It is known that the finishing done in such a way will result in a material diffusion of the substrate layer into the finishing stack which has a negative effect on the wettability of the terminal which is eventually offered to the end customer.

Figure 10:
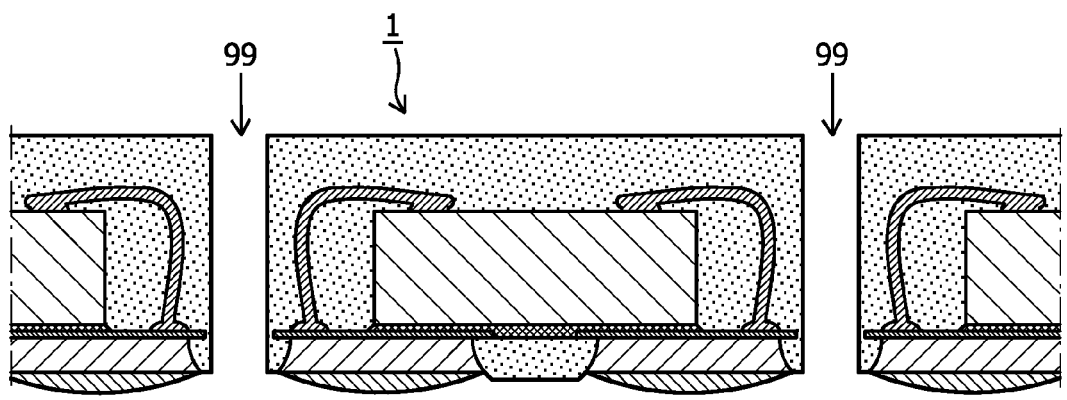

In the stage of FIG. 10 the semiconductor device 1 is cut. Cut lines 99 have been illustrated in the drawing. They are located outside an area of the contact regions 35. The semiconductor device 1 is now a packaged semiconductor chip 100 and ready for being (surface)-mounted on a PCB, which is discussed with reference to FIGS. 12 and 13.

Figure 11:
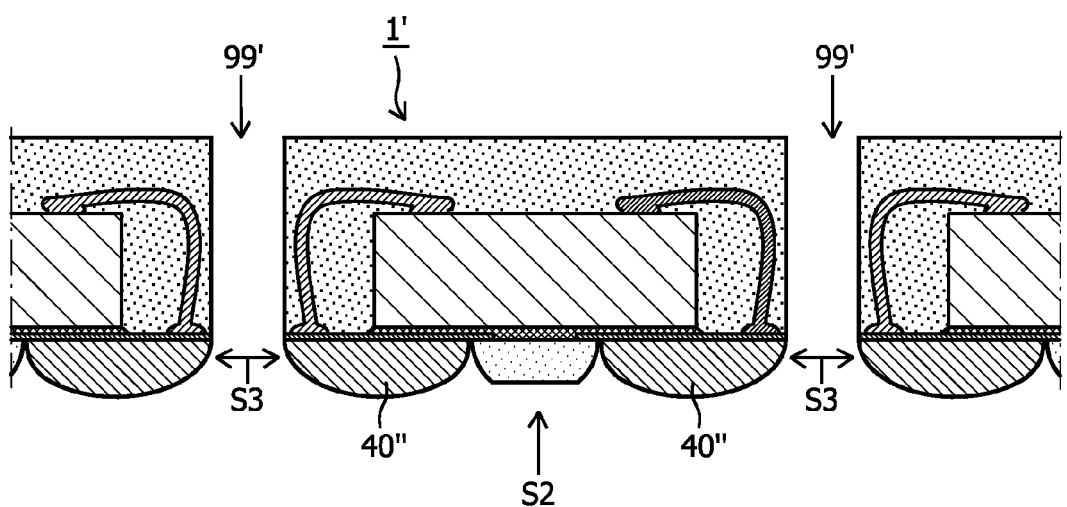
FIG. 11 shows a variant of the semiconductor device of FIG. 1 in accordance with yet another embodiment of the invention.

FIG. 11 shows a variant of the semiconductor device of FIG. 1 in accordance with yet another embodiment of the invention. This embodiment and its method of manufacturing will be discussed in as far as it differs from the embodiment of FIGS. 1 to 10. A first main difference in the method resides in the stage of FIG. 7. In order to obtain the embodiment of FIG. 11 the complete substrate layer 10 of the substrate carrier 25 is removed in this stage. The contact regions 35 are thereby defined on a backside of the contact pads 22. Furthermore, deep recesses are formed on the backside S2 of the semiconductor device 1. A second main difference in the method resides in the stage of FIG. 8. In this stage the deep recesses are filled with solder material 40, which implies that more solder material 40 is applied in this stage. A third main difference in the method resides in the stage of FIG. 9. In this stage larger solder bumps 40" are formed during reflow. A fourth main difference in the method resides in the stage of FIG. 10. In this stage the cut lines 99' are chosen such that the semiconductor device 1 is cut just along the solder bumps 40". A consequence of these modifications is that the resulting modified semiconductor device 1' has solder bumps (contact terminals) 40" with a side contact surface S3, i.e. the semiconductor device 1' is sidewettable with a strongly improved electrical contact. This is illustrated at discussed with reference to FIG. 13.

Figure 12:
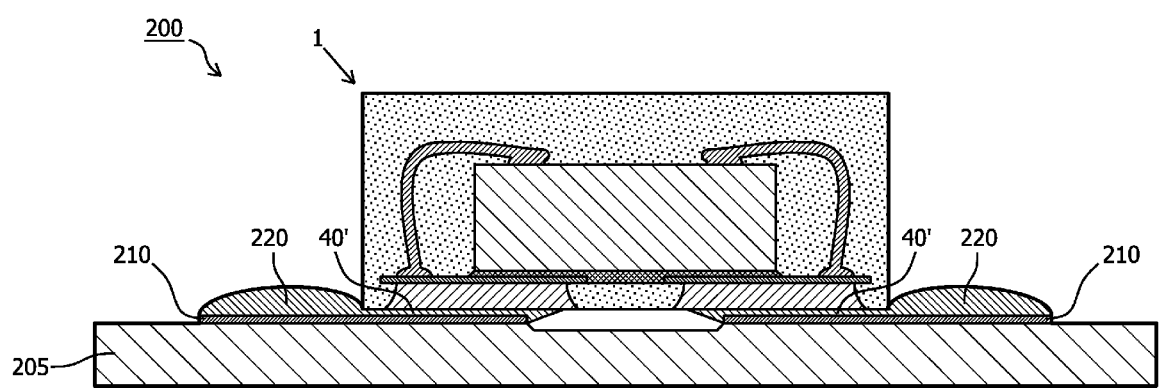
FIG. 12 shows the semiconductor device of FIG. 1 when mounted on a PCB.

FIG. 12 shows the semiconductor device of FIG. 1 when mounted on a PCB. The PCB 200 may comprise many electrical components, mechanical components and connections between them. Furthermore, it may comprise sockets for receiving packaged semiconductor devices of a different kind. All such components and parts have been left out for facilitating understanding of the invention. FIG. 12 shows a PCB carrier 205 having contact pads 210 onto which further solder bumps 220 have been provided. The semiconductor device 1 has been soldered with its solder bumps 40' to the further solder bumps 220 of the PCB. In this soldering process both bumps melt together which provides for a very good electrical contact with a low contact resistance.

Figure 13:
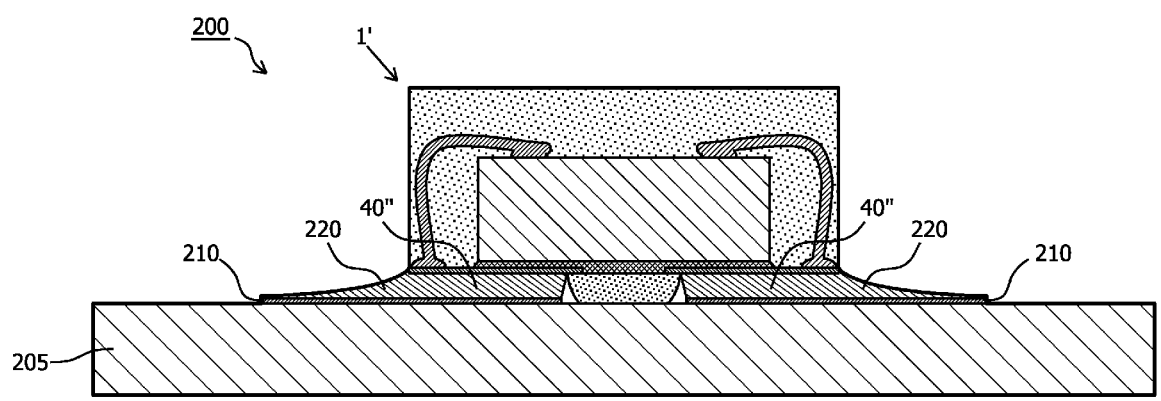
FIG. 13 shows the semiconductor device of FIG. 11 when mounted on a PCB.

FIG. 13 shows the semiconductor device of FIG. 11 when mounted on a PCB. This figure is described in as far as it differs from FIG. 12. The modified semiconductor device 1' is sidewettable and therefore the further solder bumps 220 of the PCB have melted together with the larger (and sidewettable) solder bumps 40" of the semiconductor device 1', wherein the contact area between those solder bumps 40", 220 has been significantly increased, i.e. the contact resistance has been significantly reduced and where terminal side-wettability is assured by design which makes it suitable for automated board inspection tools.

The invention thus provides a method of manufacturing a semiconductor device 1, the method comprising: i) providing a substrate carrier 25 comprising a substrate layer 10 and a patterned conductive layer 20, wherein the patterned conductive layer 20 defines contact pads 22; ii) partially etching the substrate carrier 25 using the patterned conductive layer 20 as a mask defining contact regions 35 in the substrate layer 10; iii) providing the semiconductor chip 100; iv) mounting said semiconductor chip 100 with the adhesive layer 105 on the patterned conductive layer 20 such that the semiconductor chip covers at least one of the trenches 29 and part of the contact pads neighboring the respective trench 29 are left uncovered for future wire bonding; v) providing wire bonds 110 between respective terminals of the semiconductor chip 100 and respective contact pads 22 of the substrate carrier 25; vi) providing a molding compound 30 covering the substrate carrier 25 and the semiconductor chip 100, and vii) etching the backside S2 of the substrate carrier 25 to expose the molding compound 30 in the trenches 29. The invention further provides a semiconductor device 1 manufactured with such method, and a printed-circuit board 200 comprising such semiconductor device 1. The invention enables a reduced minimum bondpad pitch. An embodiment of the invention has a by-design-wettable terminal side at the perimeter of the device. This latest mentioned feature enables automated board inspection wrt board mounting quality.

The invention may be applied in various application areas. For example, the invention may be applied in semiconductor device manufacturing, and in particular in the packaging of surface-mountable semiconductor devices with a low pin-count.

Various variations of the invention are possible and do not depart from the scope of the invention as claimed.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage. Throughout the Figures, similar or corresponding features are indicated by same reference numerals or labels.

The invention claimed is:

1. A method of manufacturing a semiconductor device, the method comprising:
providing a substrate carrier having a front side and a backside opposite to the front side (S1), the substrate carrier comprising a substrate layer and a patterned conductive layer at the front side (S1) of the substrate carrier, wherein the patterned conductive layer defines contact pads to be formed for being connected to terminals of a semiconductor chip;
partially etching the substrate carrier using the patterned conductive layer as a mask to obtain trenches in the substrate carrier and defining contact regions in the substrate layer;
providing the semiconductor chip comprising the terminals at a first side (S1) and an adhesive layer at a second side opposite to the first side (S1);
mounting said semiconductor chip with the adhesive layer on the patterned conductive layer such that the semiconductor chip covers at least one of the trenches and part of the contact pads neighboring the respective trench are left uncovered for future wire bonding;
providing wire bonds between respective terminals of the semiconductor chip and respective contact pads of the substrate carrier;
providing a molding compound covering the substrate carrier and the semiconductor chip and filling the trenches, and
etching the backside (S2) of the substrate carrier, preferably selective to the substrate layer, to expose the molding compound in the trenches for separating the contact regions at the backside (S2) of the substrate layer that are in electrical contact with the respective contact pads wherein, during the etching of the backside (S2) of the substrate carrier the substrate layer is completely removed from the entire patterned conductive layer such that the contact regions are located directly on a backside (S2) of the contact pads.

2. The method as claimed in claim 1, further comprising:
providing solder material on each respective one of the contact regions for being attached to receiving contacts of a printed-circuit board.

3. The method as claimed in claim 2, wherein the providing of the solder material comprises screen printing solder paste or solder ball placement on the backside (S2) of the substrate layer.

4. The method as claimed in claim 3, further comprising:
heating the semiconductor device to a predefined temperature during a predefined time period to obtain reflow of the solder material for forming solder bumps on the backside of the semiconductor device at locations of the contact regions.

5. The method as claimed in claim 2, wherein, during the providing of the solder material, the solder material is provided directly on the backside (S2) of the contact pads.

6. The method as claimed in claim 1, further comprising:
cutting the semiconductor device outside an area of the contact regions for obtaining a packaged semiconductor chip.

7. The method as claimed in claim 6 wherein, during the cutting of the semiconductor device, the semiconductor device is cut just along an outer envelope of the solder bumps such that the solder bumps are exposed to an outer side of the semiconductor device.

8. The method as claimed in claim 1, wherein the patterned conductive layer is configured for defining contact pads with a pitch smaller than or equal to 400 μm, preferably smaller than 250 μm, and even more preferably smaller than or equal to 150 μm.

* * * * *